US012796358B2

(12) United States Patent
Zhou et al.

(10) Patent No.: US 12,796,358 B2
(45) Date of Patent: Nov. 10, 2026

(54) PHOTOLITHOGRAPHY ENHANCEMENT TECHNIQUES

(71) Applicant: Applied Materials, Inc., Santa Clara, CA (US)

(72) Inventors: Yifeng Zhou, Fremont, CA (US); Zhuangfei Chen, Fremont, CA (US); Qian Fu, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 426 days.

(21) Appl. No.: 18/096,207

(22) Filed: Jan. 12, 2023

(65) Prior Publication Data

US 2024/0242970 A1 Jul. 18, 2024

(51) Int. Cl.
*H10P 50/24* (2026.01)
*H05K 3/06* (2006.01)
(Continued)

(52) U.S. Cl.
CPC ........... *H10P 50/242* (2026.01); *H05K 3/064* (2013.01); *H10P 50/73* (2026.01); *H10P 76/2041* (2026.01)

(58) Field of Classification Search
None
See application file for complete search history.

(56) References Cited

U.S. PATENT DOCUMENTS

2015/0104957 A1 4/2015 Takachi et al.
2016/0379824 A1* 12/2016 Wise .................... H10P 50/244 438/695

(Continued)

FOREIGN PATENT DOCUMENTS

JP 2020521320 A 7/2020
JP 2023002466 A 1/2023

(Continued)

OTHER PUBLICATIONS

Application No. PCT/US2024/010430 , International Search Report and Written Opinion, Mailed On Apr. 29, 2024, 9 pages.

(Continued)

*Primary Examiner* — Binh X Tran
(74) *Attorney, Agent, or Firm* — Kilpatrick Townsend & Stockton LLP

(57) ABSTRACT

Exemplary methods of semiconductor processing may include providing deposition precursors to a processing region of a semiconductor processing chamber. A substrate may be housed in the processing region. The substrate may include a photoresist material overlying a silicon-containing material. The photoresist material may define an aperture. The processing region may be at least partially defined above a substrate support on which the substrate is seated. The methods may include forming plasma effluents of the deposition precursors. The methods may include depositing a material on the photoresist material. The methods may include providing an etchant precursor to the processing region of the semiconductor processing chamber. A bias power may be applied to the substrate support from a bias power source. The methods may include etching a portion of the photoresist material. The etching may decrease a local critical dimension uniformity of the aperture of the photoresist material.

20 Claims, 5 Drawing Sheets

(51) Int. Cl.
*H10P 50/00* (2026.01)
*H10P 76/20* (2026.01)

(56) References Cited

U.S. PATENT DOCUMENTS

| | | | | |
|---|---|---|---|---|
| 2018/0314155 | A1 | 11/2018 | Hou et al. | |
| 2018/0337046 | A1* | 11/2018 | Shamma | H10P 76/4088 |
| 2019/0198338 | A1* | 6/2019 | Kim | H10P 50/695 |
| 2019/0259612 | A1 | 8/2019 | Nozawa et al. | |
| 2022/0102200 | A1 | 3/2022 | Tung et al. | |
| 2022/0406609 | A1* | 12/2022 | Yonezawa | H10P 50/242 |
| 2023/0134436 | A1* | 5/2023 | Ishikawa | H10P 50/695 438/706 |
| 2023/0178641 | A1* | 6/2023 | Cha | H10D 64/205 257/280 |

FOREIGN PATENT DOCUMENTS

| | | | | |
|---|---|---|---|---|
| JP | 2023067443 | A * | 5/2023 | H01L 21/31144 |
| KR | 20170000361 | A | 1/2017 | |
| KR | 20190142426 | A | 12/2019 | |

OTHER PUBLICATIONS

Korean Application No. 10-2025-7026331, Office Action mailed on Mar. 9, 2026, 26 pages (12 pages of original document and 14 pages of English Translation).

Japanese Application No. 2025-540163, Office Action mailed on Jun. 2, 2026, 7 pages (3 pages of original document and 4 pages of English Translation).

* cited by examiner

PHOTOLITHOGRAPHY ENHANCEMENT TECHNIQUES

TECHNICAL FIELD

The present technology relates to semiconductor processes and materials. More specifically, the present technology relates to enhancing material uniformity during photolithography operations.

BACKGROUND

Integrated circuits are made possible by processes which produce intricately patterned material layers on substrate surfaces. Producing patterned material on a substrate requires controlled methods of formation and removal of exposed material. Chemical etching is used for a variety of purposes including transferring a pattern in a photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and may also sometimes deform the remaining material. Dry etches produced in local plasmas formed within the semiconductor processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods of semiconductor processing may include providing deposition precursors to a processing region of a semiconductor processing chamber. A substrate may be housed in the processing region. The substrate may include a photoresist material overlying a silicon-containing material. The photoresist material may define an aperture. The processing region may be at least partially defined above a substrate support on which the substrate is seated. The methods may include forming plasma effluents of the deposition precursors. The methods may include depositing a material on the photoresist material. The methods may include providing an etchant precursor to the processing region of the semiconductor processing chamber. A bias power may be applied to the substrate support from a bias power source. The methods may include etching a portion of the photoresist material. The etching may decrease a local critical dimension uniformity of the aperture of the photoresist material.

In embodiments, the deposition precursors may be or include a silicon-containing precursor. The material deposited on the photoresist material may be or include silicon oxide. A source plasma power applied from a source power source to form plasma effluents of the deposition precursors may be less than or about 1,000 W. The etchant precursor may be or include a fluorine-containing precursor. The local critical dimension uniformity may be less than or about 3 nm 3σ. Depositing the material on the photoresist material may be performed at a first pressure. Etching the portion of the photoresist material may be performed at a second pressure. The second pressure may be greater than the first pressure. The second pressure may be less than or about 30 Torr. A bias plasma power applied from the bias power source while etching the portion of the photoresist material may be less than or about 500 W. A source plasma power applied from a source power source while etching the portion of the photoresist material may be less than or about 100 W. The methods may include, subsequent to etching the portion of the photoresist material, etching the silicon-containing material to form apertures in the silicon-containing material.

Some embodiments of the present technology may encompass providing a silicon-containing precursor to a processing region of a semiconductor processing chamber. A substrate may be housed in the processing region. The substrate may include a photoresist material overlying a first silicon-containing material. The photoresist material may define an aperture. The processing region may be at least partially defined above a substrate support on which the substrate is seated. The methods may include forming plasma effluents of the silicon-containing precursor. The methods may include depositing a second silicon-containing material on the photoresist material. The methods may include providing a fluorine-containing precursor to the processing region of the semiconductor processing chamber. The methods may include etching a portion of the photoresist material extending outward from the second silicon-containing material.

In embodiments, the aperture in the photoresist material may be characterized by a width of less than or about 30 nm. The first silicon-containing material may be or include a silicon-oxygen-and-nitrogen material. A pressure within the semiconductor processing chamber may be maintained at less than or about 30 Torr. The etching may decrease a local critical dimension uniformity of the aperture of the photoresist material. Prior to the etching, the local critical dimension uniformity may be greater than 4 nm 3σ.

Some embodiments of the present technology may encompass semiconductor processing methods. The methods may include providing a silicon-containing precursor to a processing region of a semiconductor processing chamber. A substrate may be housed in the processing region. The substrate may include a photoresist material overlying a first silicon-containing material. The photoresist material may define an aperture. A width of the aperture may be less than or about 30 nm. The processing region may be at least partially defined above a substrate support on which the substrate is seated. The methods may include forming plasma effluents of the silicon-containing precursor. The methods may include depositing a second silicon-containing material on the photoresist material. The methods may include halting a flow of the silicon-containing precursor. The methods may include providing a fluorine-containing precursor to the processing region of the semiconductor processing chamber. The methods may include etching a portion of the photoresist material extending outward from the second silicon-containing material.

In embodiments, the silicon-containing precursor may be or include silicon tetrachloride ($SiCl_4$). Depositing the second silicon-containing material and etching the portion of the photoresist material may be performed in the same processing region of the same semiconductor processing chamber.

Such technology may provide numerous benefits over conventional systems and techniques. For example, the processes and structures may transfer photoresist material critical dimensions at the upper surface of the photoresist material throughout an entire thickness of the photoresist material by etching the tapered profiles in the apertures defined in the photoresist material. Additionally, the operations of embodiments of the present technology may allow for reduced ultra violet or extreme ultra violet doses during lithography operations for patterning photoresist materials. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
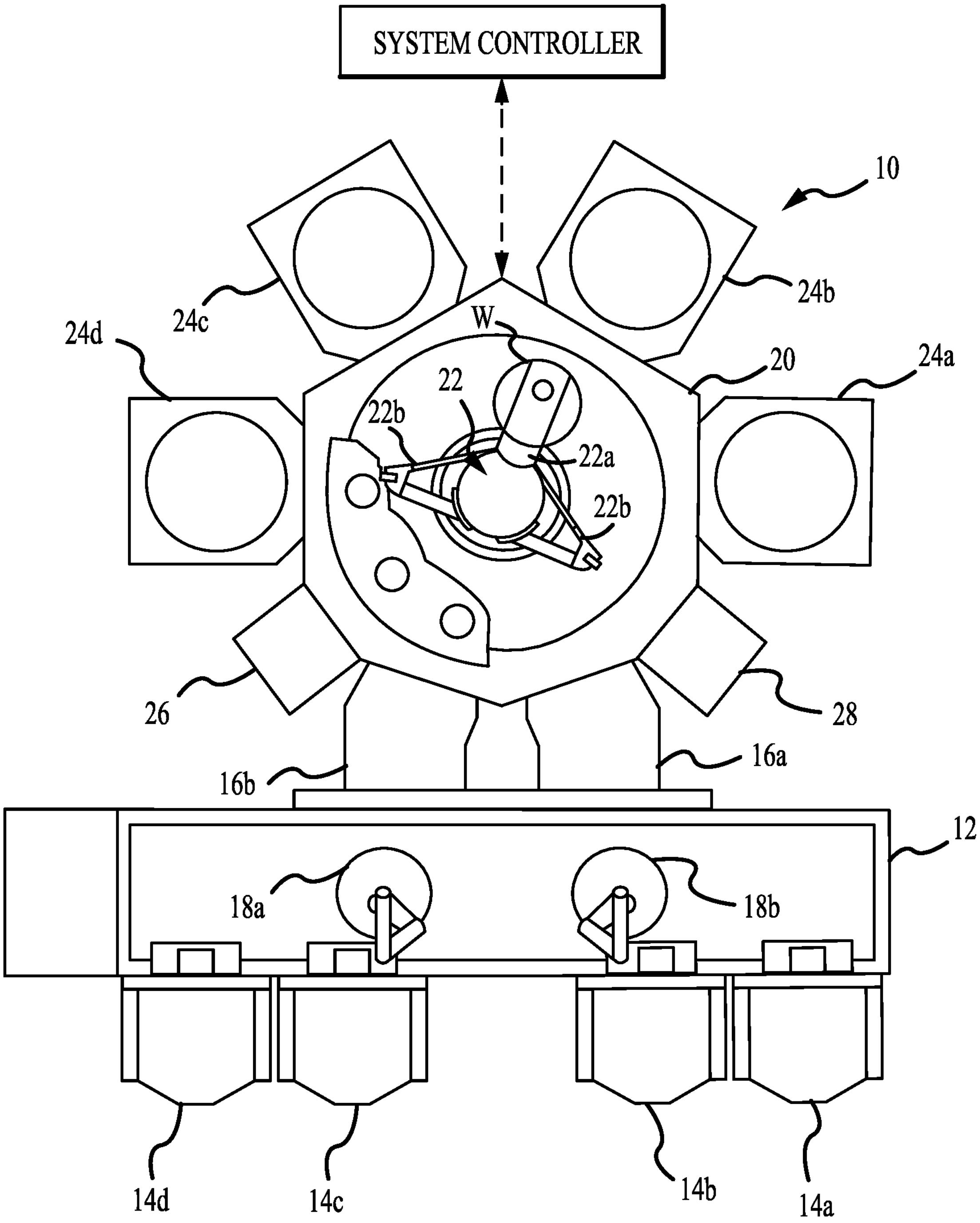
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

When moving towards smaller technology nodes, such as the 7 nm node and smaller in semiconductor fabrication, improved techniques for patterning, such as extreme ultraviolet ("EUV") lithography may be used. EUV lithography utilizes a photomask structure that has been patterned with a specific integrated circuit design. The photomask is then incorporated in a lithography scanner, and used to pattern images on a substrate. EUV technology may be characterized by several challenges, including patterning small features in the photoresist to be patterned. One issue includes the imperfect patterning of the photoresist that results in openings in the photoresist, or apertures, being characterized by tapered sidewalls. These tapered sidewalls are not uniform and may differ between individual openings made in the photoresist. These nonuniformities may propagate through underlying layers during patterning processes.

The present technology overcomes these issues by performing a deposition of material on the photoresist material that preferentially deposits material on the upper surface of the photoresist. After the material is deposited on the upper surface of the photoresist, an etch may be performed to transfer the upper critical dimension of the openings in the photoresist throughout a thickness of the photoresist. The upper critical dimension of the openings in the photoresist may be much more uniform throughout the photoresist compared to the bottom critical dimension.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with the described processes or materials alone. Moreover, although an exemplary chamber is described to provide foundation for the present technology, it is to be understood that the present technology can be applied to virtually any semiconductor processing chamber or combination of chambers that may allow the operations described.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24*a-d*, a transfer chamber 20, a service chamber 26, an integrated metrology chamber 28, and a pair of load lock chambers 16*a-b*. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22*a* attached to the distal ends of extendible arms 22*b*, respectively. The blades 22*a* may be used for carrying individual substrates to and from the process chambers. In operation, one of the substrate transport blades such as blade 22*a* of the transport mechanism 22 may retrieve a substrate W from one of the load lock chambers such as chambers 16*a-b* and carry substrate W to a first stage of processing, for example, a treatment process as described below in chambers 24*a-d*. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22*a* and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16*a-b*. From the load lock chambers 16*a-b*, the substrate may move into a factory interface 12. The factory interface 12 generally may operate to transfer substrates between pod loaders 14*a-d* in an atmospheric pressure clean environment and the load lock chambers 16*a-b*. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18*a-b*, may be positioned in factory interface 12 to transport substrates between various positions/locations within factory interface 12 and to other locations in communication therewith. Robots 18*a-b* may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24*a-d* may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
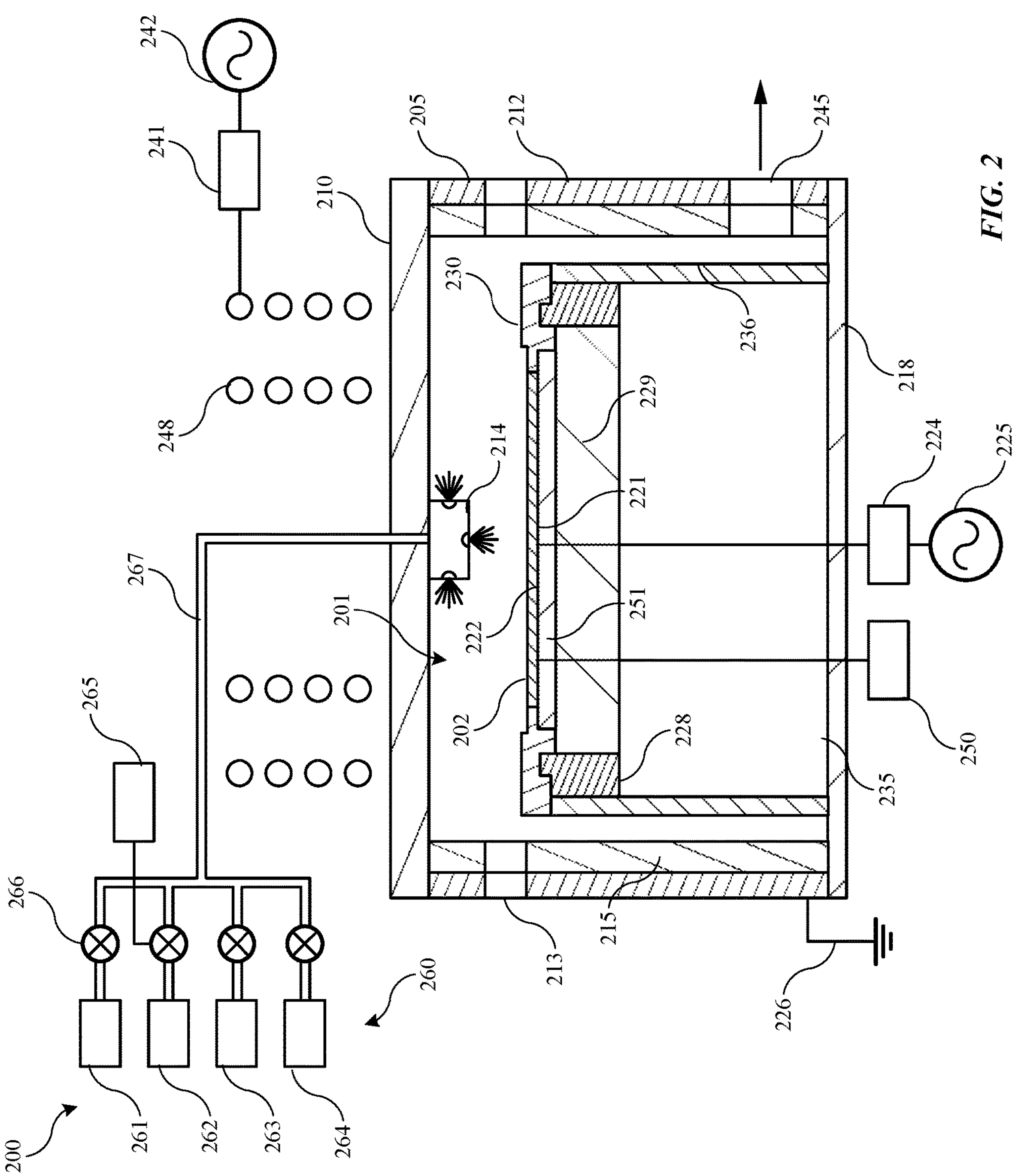
FIG. 2 shows a schematic cross-sectional view of an exemplary processing system according to some embodiments of the present technology.

FIG. 2 illustrates a schematic cross-sectional view of an exemplary processing chamber 200 suitable for patterning a material layer disposed on a substrate 202 in the processing chamber 200. The exemplary processing chamber 200 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 200 may include a chamber body 205 defining a chamber volume 201 in which a substrate may be processed. The chamber body 205 may have sidewalls 212 and a bottom 218 which are coupled with ground 226. The sidewalls 212 may have a liner 215 to protect the sidewalls 212 and extend the time between maintenance cycles of the plasma processing chamber 200. The dimensions of the chamber body 205 and related components of the plasma processing chamber 200 are not limited and generally may be proportionally larger than the size of the substrate 202 to be processed therein. Examples of substrate sizes include 200 mm diameter, 250 mm diameter, 300 mm diameter and 450 mm diameter, among others, such as display or solar cell substrates as well.

The chamber body 205 may support a chamber lid assembly 210 to enclose the chamber volume 201. The chamber body 205 may be fabricated from aluminum or other suitable materials. A substrate access port 213 may be formed through the sidewall 212 of the chamber body 205, facilitating the transfer of the substrate 202 into and out of the plasma processing chamber 200. The access port 213 may be coupled with a transfer chamber and/or other chambers of a substrate processing system as previously described. A pumping port 245 may be formed through the sidewall 212 of the chamber body 205 and connected to the chamber volume 201. A pumping device may be coupled through the pumping port 245 to the chamber volume 201 to evacuate and control the pressure within the processing volume. The pumping device may include one or more pumps and throttle valves.

A gas panel 260 may be coupled by a gas line 267 with the chamber body 205 to supply process gases into the chamber volume 201. The gas panel 260 may include one or more process gas sources 261, 262, 263, 264 and may additionally include inert gases, non-reactive gases, and reactive gases, as may be utilized for any number of processes. Examples of process gases that may be provided by the gas panel 260 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, silicon and hydrogen containing gases such as $BCl_3$, $Cl_2$, $SiCH_4$, $CF_4$, $C_2F_4$, $C_4F_8$, $C_4F_6$, $CHF_3$, $CH_2F_2$, $CH_3F$, $NF_3$, $NH_3$, $CO_2$, $SO_2$, CO, COS, $N_2$, $NO_2$, $N_2O$, $O_2$, HBr, and $H_2$, among any number of additional precursors.

Valves 266 may control the flow of the process gases from the sources 261, 262, 263, 264 from the gas panel 260 and may be managed by a controller 265. The flow of the gases supplied to the chamber body 205 from the gas panel 260 may include combinations of the gases form one or more sources. The lid assembly 210 may include a nozzle 214. The nozzle 214 may be one or more ports for introducing the process gases from the sources 261, 262, 264, 263 of the gas panel 260 into the chamber volume 201. After the process gases are introduced into the plasma processing chamber 200, the gases may be energized to form plasma. An antenna 248, such as one or more inductor coils, may be provided adjacent to the plasma processing chamber 200. An antenna power supply 242 may power the antenna 248 through a match circuit 241 to inductively couple energy, such as RF energy, to the process gas to maintain a plasma formed from the process gas in the chamber volume 201 of the plasma processing chamber 200. Alternatively, or in addition to the antenna power supply 242, process electrodes below the substrate 202 and/or above the substrate 202 may be used to capacitively couple RF power to the process gases to maintain the plasma within the chamber volume 201. The operation of the power supply 242 may be controlled by a controller, such as controller 265, that also controls the operation of other components in the plasma processing chamber 200.

A substrate support pedestal 235 may be disposed in the chamber volume 201 to support the substrate 202 during processing. The substrate support pedestal 235 may include an electrostatic chuck 222 for holding the substrate 202 during processing. The electrostatic chuck ("ESC") 222 may use the electrostatic attraction to hold the substrate 202 to the substrate support pedestal 235. The ESC 222 may be powered by an RF power supply 225 integrated with a match circuit 224. The ESC 222 may include an electrode 221 embedded within a dielectric body. The electrode 221 may be coupled with the RF power supply 225 and may provide a bias which attracts plasma ions, formed by the process gases in the chamber volume 201, to the ESC 222 and substrate 202 seated on the pedestal. The RF power supply 225 may cycle on and off, or pulse, during processing of the substrate 202. The ESC 222 may have an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the plasma processing chamber 200.

Electrode 221 may be coupled with a power source 250. The power source 250 may provide a chucking voltage of about 200 volts to about 2000 volts to the electrode 221. The power source 250 may also include a system controller for controlling the operation of the electrode 221 by directing a DC current to the electrode 221 for chucking and de-chucking the substrate 202. The ESC 222 may include heaters disposed within the pedestal and connected to a power source for heating the substrate, while a cooling base 229 supporting the ESC 222 may include conduits for circulating a heat transfer fluid to maintain a temperature of the ESC 222 and substrate 202 disposed thereon. The ESC 222 may be configured to perform in the temperature range required by the thermal budget of the device being fabricated on the substrate 202. For example, the ESC 222 may be configured to maintain the substrate 202 at a temperature of about −150° C. or lower to about 500° C. or higher depending on the process being performed.

The cooling base 229 may be provided to assist in controlling the temperature of the substrate 202. To mitigate process drift and time, the temperature of the substrate 202 may be maintained substantially constant by the cooling base 229 throughout the time the substrate 202 is in the chamber. In some embodiments, the temperature of the substrate 202 may be maintained throughout subsequent processes at temperatures between about −150° C. and about 500° C., although any temperatures may be utilized. A cover ring 230 may be disposed on the ESC 222 and along the periphery of the substrate support pedestal 235. The cover ring 230 may be configured to confine etching gases to a desired portion of the exposed top surface of the substrate 202, while shielding the top surface of the substrate support pedestal 235 from the plasma environment inside the plasma processing chamber 200. Lift pins may be selectively translated through the substrate support pedestal 235 to lift the substrate 202 above the substrate support pedestal 235 to facilitate access to the substrate 202 by a transfer robot or other suitable transfer mechanism as previously described.

The controller 265 may be utilized to control the process sequence, regulating the gas flows from the gas panel 260 into the plasma processing chamber 200, and other process parameters. Software routines, when executed by the CPU, transform the CPU into a specific purpose computer such as a controller, which may control the plasma processing chamber 200 such that the processes are performed in accordance with the present disclosure. The software routines may also be stored and/or executed by a second controller that may be associated with the plasma processing chamber 200.

Figure 3:
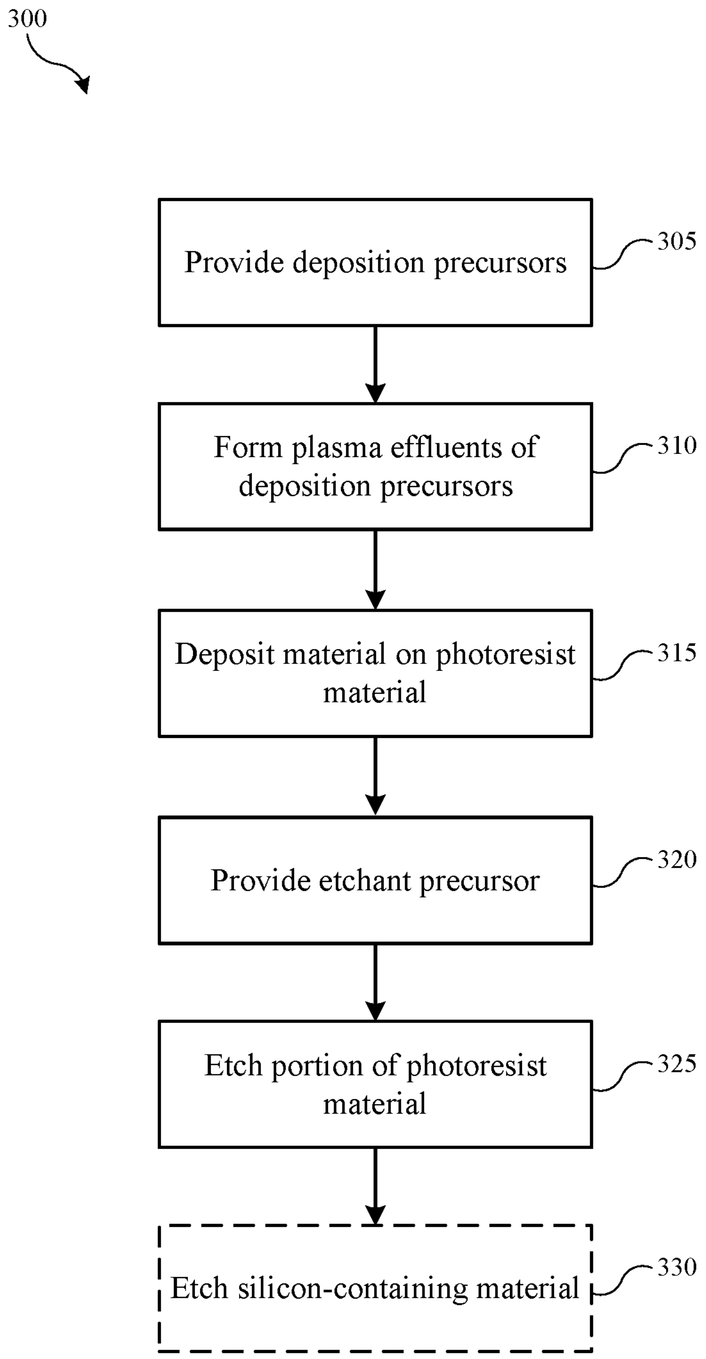
FIG. 3 shows selected operations in a formation method according to some embodiments of the present technology.

As noted above, the present technology may trim a photoresist material to make the apertures defined in the photoresist material more uniform. Turning to FIG. 3 is shown exemplary operations in a method 300 of semiconductor processing according to embodiments of the present technology. Method 300 may include one or more operations prior to the initiation of the method, including front-end processing, deposition, etching, polishing, cleaning, or any other operations that may be performed prior to the described operations. For example, the method may begin after a number of layers of material overlying the substrate have been deposited and the photoresist material has been patterned, such as through a photographic operation. However, as explained above, it is to be understood that the figures illustrate just one exemplary process of enhancing photolithographic patterning according to embodiments of the present technology may be employed, and the description is not intended to limit the technology to this process alone. Some or all of the operations may be performed in chambers or system tools as previously described, or may be performed in different chambers on the same system tool, which may include the chamber in which the operations of method 300 may be performed.

Method 300 may include a number of optional operations as illustrated, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4D, the illustrations of which will be described in conjunction with the operations of method 300. It is to be understood that FIGS. 4A-4D illustrate only partial schematic views, and a substrate may contain any number of structural sections having aspects as illustrated in the figures, as well as alternative structural aspects that may still benefit from operations of the present technology.

Figure 4A:
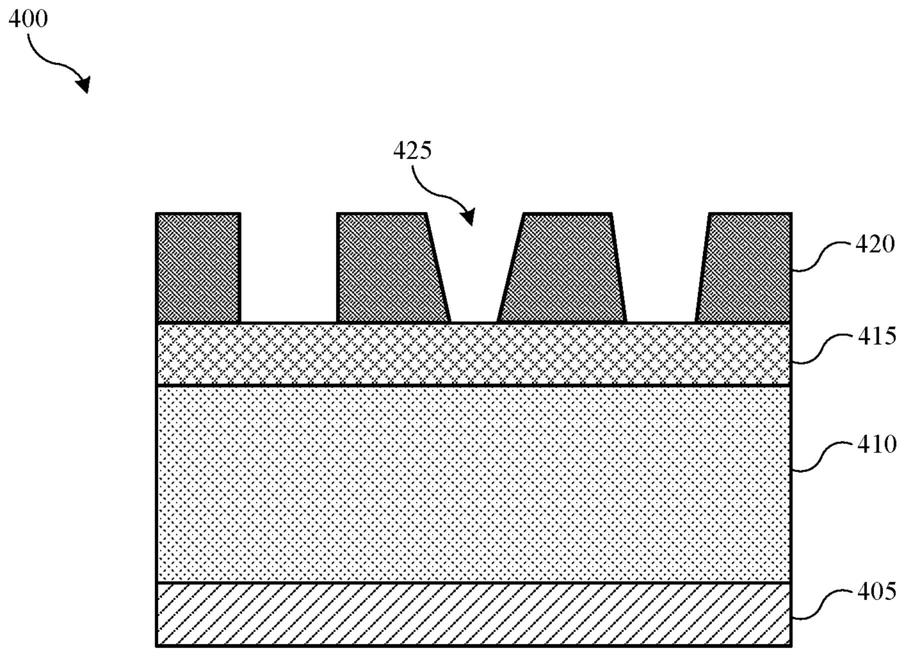
FIGS. 4A-4D illustrate schematic cross-sectional views of substrate materials on which selected operations are being performed according to some embodiments of the present technology.

Method 300 may or may not involve optional operations to develop the semiconductor structure to a particular fabrication operation. It is to be understood that method 300 may be performed on any number of semiconductor structures, and FIGS. 4A-4D illustrate one exemplary structure within which an etching process may be performed. As illustrated in FIG. 4A, a processed semiconductor structure 400 may include a substrate 405, which may include a carbon-containing material 410, such as an amorphous carbon-containing material, overlying the substrate 405. The processed semiconductor structure 400 may also include a silicon-containing material 415 overlying the carbon-containing material 410. The silicon-containing material 415 may be a silicon-and-oxygen-containing material, a silicon-and-nitrogen-containing material, silicon-and-oxygen-and-nitrogen-containing material, or any other silicon-containing material. The processed semiconductor structure 400 may also include a photoresist material 420.

The photoresist material 420 may be patterned to define at least one aperture 425 extending through an entire thickness of the photoresist material 420. The aperture 425 may expose the underlying silicon-containing material 415. Although the processed semiconductor structure 400 is illustrated with only three apertures 425, exemplary structures 400 may include any number of apertures previously discussed, which can include dozens or hundreds of apertures, and it is to be understood that the figures are only schematics to illustrate aspects of the present technology. The apertures 425 may be characterized by a width of less than or about 30 nm, and may be characterized by a width of less than or about 28 nm, less than or about 26 nm, less than or about 24 nm, less than or about 22 nm, less than or about 20 nm, less than or about 18 nm, less than or about 16 nm, less than or about 14 nm, less than or about 12 nm, less than or about 10 nm, or less.

Method 300 may include providing deposition precursors to a processing region of a semiconductor processing chamber at operation 305. The processing region may house a substrate, such as processed semiconductor structure 400. The deposition precursors may include a silicon-containing precursor and an oxygen-containing precursor. Silicon-containing precursors that may be used during deposition may include, but are not limited to, silane ($SiH_4$), disilane ($Si_2H_6$), trisilane ($Si_3H_8$), tetrasilane ($Si_4H_{10}$), pentasilane ($Si_5H_{12}$), or other organosilanes including cyclohexasilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-and-oxygen-containing film formation. Oxygen-containing precursors that may be used during deposition may include, but are not limited to, diatomic oxygen ($O_2$), ozone ($O_3$), as well as any other oxygen-containing precursors that may be used in silicon-and-oxygen-containing film formation.

The deposition precursors may also include any number of carrier gases, which may include nitrogen, helium, argon, or other noble, inert, or useful precursors. The carrier gases may be used to dilute the deposition precursors, which may reduce deposition rates to allow adequate control of the deposition. However, it is contemplated that the deposition precursors may be provided without any other gases.

The flow rates of deposition precursors may be adjusted, along with any other processing conditions. For example, a flow rate of the silicon-containing precursor and/or the oxygen-containing precursor may be reduced, maintained, or increased during operations 305 and/or 310 of method 300. During operations 305 and/or 310 of method 300, the flow rate of the silicon-containing precursor may be between about 1 sccm and about 1,000 sccm. Additionally, the flow rate of the silicon-containing precursor may be less than or about 900 sccm, less than or about 800 sccm, less than or about 700 sccm, less than or about 600 sccm, less than or about 500 sccm, less than or about 400 sccm, less than or about 300 sccm, less than or about 250 sccm, less than or about 200 sccm, less than or about 150 sccm, less than or about 100 sccm, less than or about 80 sccm, less than or about 60 sccm, less than or about 40 sccm, less than or about 20 sccm, or less. The flow rate may also be between any of these stated flow rates, or within smaller ranges encompassed by any of these numbers.

Similarly, during operations 305 and/or 310 of method 300, the flow rate of the oxygen-containing precursor may be between about 1 sccm and about 1,000 sccm. Additionally, the flow rate of the oxygen-containing precursor may be less than or about 900 sccm, less than or about 800 sccm, less than or about 700 sccm, less than or about 600 sccm, less than or about 500 sccm, less than or about 400 sccm, less than or about 300 sccm, less than or about 250 sccm, less than or about 200 sccm, less than or about 150 sccm, less than or about 100 sccm, less than or about 80 sccm, less than or about 60 sccm, less than or about 40 sccm, less than or about 20 sccm, or less. The flow rate may also be between any of these stated flow rates, or within smaller ranges encompassed by any of these numbers.

Method 300 may include forming plasma within the processing region of the semiconductor processing chamber at operation 310. The plasma may generate plasma effluents of the deposition precursors, including the silicon-containing precursor and/or the oxygen-containing precursor. Operations 305 and 310 may occur sequentially or may be performed substantially simultaneously in some embodiments. Additionally, the plasma may be formed initially from the silicon-containing precursor, the oxygen-containing precursor, or, if present, from one or more inert precursors prior to addition of the deposition precursors in different embodiments.

The local plasma formed of the deposition precursors may provide directional flow of plasma effluents to the structure 400 to provide a top heavy deposition. The plasma may be a low-density plasma to limit the amount of bombardment, sputtering, and surface modification. In embodiments, an inductively-coupled plasma may be formed within the processing region by applying source plasma power above the substrate 405 or to substrate support, such as the substrate support pedestal previously described, as previously described. The source plasma power may be less than or about 1,000 W, less than or about 900 W, less than or about 800 W, less than or about 700 W, less than or about 600 W, less than or about 500 W, less than or about 400 W, less than or about 300 W, or less. The plasma power may also be between any of these stated plasma powers, or within smaller ranges encompassed by any of these numbers. By utilizing a plasma power that is, for example, about 1,000 W or less, the plasma effluents may be better controlled to deposit a material 430, such as a top heavy silicon-containing material, selectively on the photoresist material 420 at operation 315.

During operation 310, a duty cycle of the source power may be less than or about 75%, and the source power may be operated at a duty cycle of less than or about 70%, less than or about 60%, less than or about 50%, less than or about 40%, less than or about 30%, less than or about 20%, or less. By operating the source power for a reduced duty cycle, such as an on-time duty of less than or about 50%, the material 430 deposited on the photoresist material may deposit preferentially on the top surface of the photoresist material 420.

Figure 4B:
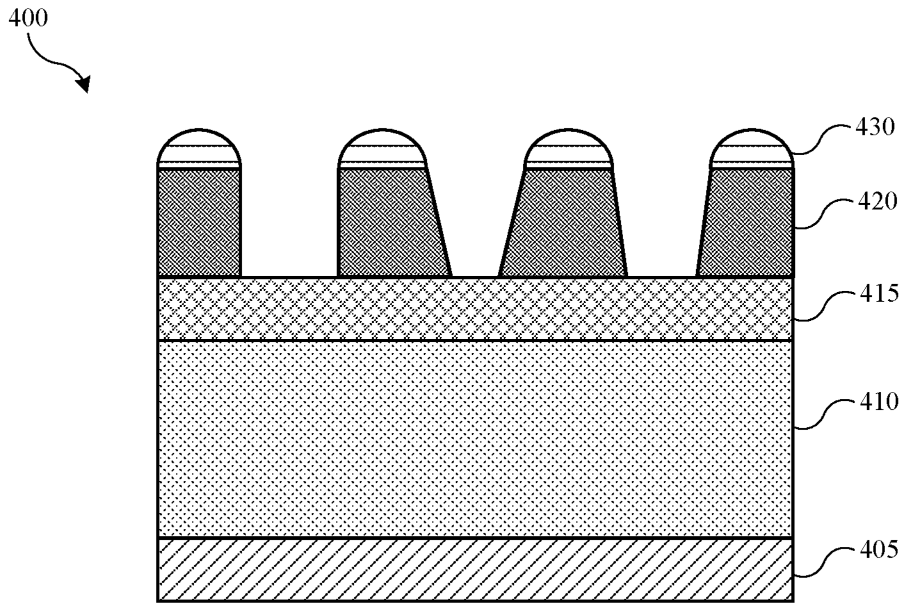

As shown in FIG. 4B, the material 430 deposited on the photoresist material 420 may deposit on an upper surface of the photoresist material 420. As previously discussed, the material 430 may be a top heavy silicon-containing material, such as silicon oxide. The deposited material 430 may form a cap or helmet on the photoresist material 420. The material 430 may preserve a top critical dimension of the photoresist material 420 during a subsequent trim operation described below.

In order to increase uniformity of the apertures 425 defined in the photoresist material 420, method 300 may include a trimming operation subsequent to depositing the material 430 on the photoresist material 420. Method 300 may include providing an etchant precursor to the processing region of the semiconductor processing chamber at operation 320. In embodiments, the etchant precursor may be a fluorine-containing precursor. The fluorine-containing precursor used at operation 320 in method 300 may include any fluorine-containing precursor. An exemplary fluorine-containing precursor may be nitrogen trifluoride ($NF_3$), which may be flowed into the processing region, without passing through any plasma along the way. Other sources of fluorine may be used in conjunction with or as replacements for the nitrogen trifluoride. In general, a fluorine-containing precursor may be flowed into the processing region and the fluorine-containing precursor may include at least one precursor selected from the group of atomic fluorine, diatomic fluorine, nitrogen trifluoride, carbon tetrafluoride ($CF_4$), hydrogen fluoride (HF), sulfur hexafluoride ($SF_6$), xenon difluoride ($XeF_2$), and various other fluorine-containing precursors used or useful in semiconductor processing. In embodiments, a hydrogen-containing precursor, such as diatomic hydrogen ($H_2$), or an oxygen-containing precursor, such as diatomic oxygen ($O_2$), may be provided in conjunction with the fluorine-containing precursor. The etchant precursor may also be provided with any number of carrier gases, which may include nitrogen, helium, argon, or other noble, inert, or useful precursors. The carrier gases may be used to dilute the fluorine-containing precursor, which may reduce etching rates to allow adequate control of the etch. However, it is contemplated that the fluorine-containing precursor may be provided without any other gases.

Figure 4C:
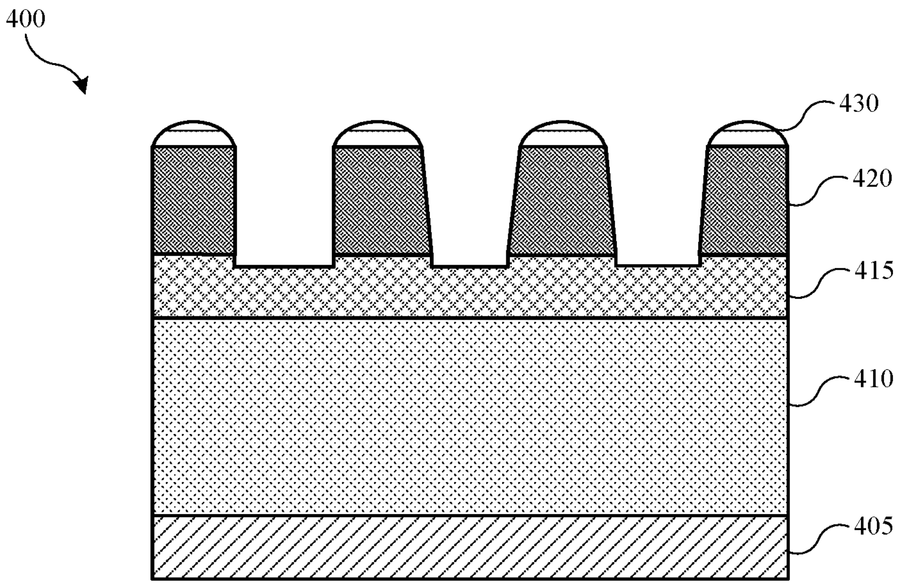

Semiconductor structure 400 may be contacted with the etchant precursor or plasma effluents thereof, which may perform an etch or removal of a portion of the photoresist material 420 at operation 325. As illustrated in FIG. 4C, plasma effluents may contact the semiconductor structure 400, and may contact all exposed surfaces, including surfaces to be etched, such as the photoresist material 420, as well as surfaces to be maintained, such as silicon-containing material 415 and material 430. During operation 325, sidewalls of the apertures 425 in the photoresist material 420 may be etched. Specifically, photoresist material 420 extending outward from the material 430, or beyond an outer dimension of the material 430, may be removed. Such a trimming operation may reduce or remove critical dimension nonuniformities in the apertures 425 defined in the photoresist material 420 by straightening tapered photoresist material 420 profiles while maintaining a top critical dimension of the apertures 425 in the photoresist material 420. Etching the photoresist material 420 may result in a dimension of the aperture 425 at an upper surface of the photoresist material 420 opposite a surface of the photoresist material 420 in contact with the underlying silicon-containing material 415 to be translated throughout a thickness of the photoresist material 420.

Embodiments of the present technology may remove the photoresist material 420 extending beyond the material 430 or any of the other materials on the structure 400 at a rate of at least about 1:1, and may etch hafnium oxide relative to silicon oxide or other materials noted at a selectivity greater than or about 2:1, greater than or about 3:1, greater than or about 4:1, greater than or about 5:1, greater than or about 10:1, or more. For example, etching performed according to some embodiments of the present technology may etch the photoresist material 420 extending outward from the material 430 while substantially or essentially maintaining the material 430 or other materials.

During operations 320 and/or 325, a bias power may be applied to the substrate support from a bias power source. The plasma may be a low-level plasma to increase the directionality of the etchant precursor. The bias plasma power may be less than or about 1,000 W, less than or about 900 W, less than or about 800 W, less than or about 700 W, less than or about 600 W, less than or about 500 W, less than or about 400 W, less than or about 300 W, less than or about 200 W, less than or about 100 W, or less. The plasma power may also be between any of these stated plasma powers, or within smaller ranges encompassed by any of these numbers. By utilizing a bias plasma power that is, for example, about 1,000 or less, the plasma effluents may have increased directionality, which may result in a trim operation that reduces or removes critical dimension nonuniformities in the apertures 425 defined in the photoresist material 420. In embodiments, only a bias power may be applied during operations 320 and/or 325, and a source power may not be applied. However, it is contemplated that in some embodiments a source power may be applied at a source plasma power of less than or about 250 W, less than or about 200 W, less than or about 150 W, less than or about 100 W, less than or about 50 W, less than or about 25 W, less than or about 10 W, or less.

The trimming of the photoresist material 420 at operation 325 may provide a reduced local critical dimension uniformity (LCDU) of less than or about 3 nm 3σ, and may provide a LCDU of less than or about 2.8 nm 3σ, less than or about 2.6 nm 3σ, less than or about 2.4 nm 3σ, less than or about 2.2 nm 3σ, less than or about 2.0 nm 3σ, less than or about 1.8 nm 3σ, or less. The LCDU, prior to the etching at operation 325, may be greater than 4 nm, Conventional technologies, without trimming the photoresist material may be suffer from increased values of LCDU, such as greater than 4 nm 3σ, due to the variability of the tapering in the apertures defined in the photoresist material.

Figure 4D:
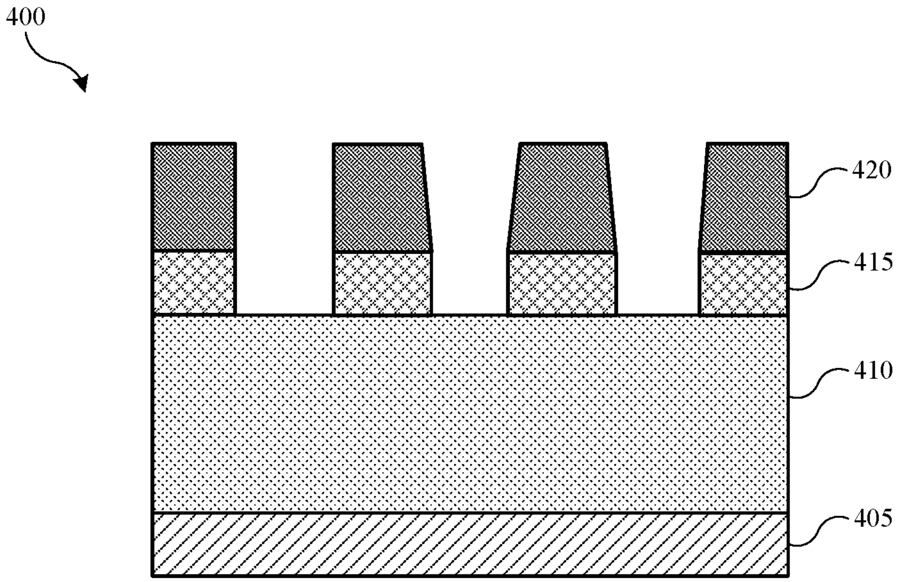

After the photoresist material 420 is trimmed at operation 325, further processing may include etching the silicon-containing material 415 as shown in FIG. 4D. The trimmed photoresist material 420 with increased aperture 425 uniformity may allow for a more uniform etch of the silicon-containing material. The silicon-containing material 415 may be etched using any etch process operable to etch silicon-containing materials, such as silicon oxide, silicon nitride, and/or silicon oxynitride. In one exemplary embodiment, etchant precursors for etching the silicon-containing material 415 may include a fluorine-containing precursor, such as carbon tetrafluoride ($CF_4$), a hydrogen-containing precursor, such as diatomic hydrogen ($H_2$), and one or more carrier gasses, such as diatomic nitrogen ($N_2$). However, any other etch process operable to remove silicon-containing material at a high selectivity relative to the photoresist material 420 is contemplated. As shown in FIG. 4D, operation 325 may also etch the material 430 deposited on the upper surface of the photoresist material 420.

Process conditions may impact the operations performed in method 300. Each of the operations of method 300 may be performed during a constant temperature in embodiments, while in some embodiments the temperature may be adjusted during different operations. For example, the substrate, pedestal, or chamber temperature during processing may be maintained at a temperature less than or about 100° C., less than or about 90° C., less than or about 80° C., less than or about 70° C., less than or about 60° C., less than or about 50° C., and in some embodiments the temperature may be maintained less than or about 40° C., less than or about 30° C., less than or about 20° C., less than or about 10° C., less than or about 0° C., less than or about −10° C., less than or about −20° C., less than or about −30° C., or less.

The pressure within the processing chamber may be controlled during method 300. For example, the pressure within the processing chamber may be maintained below or about 30 Torr. Additionally, in embodiments, the pressure within the processing chamber may be maintained below or about 28 Torr, below or about 26 Torr, below or about 24 Torr, below or about 22 Torr, below or about 20 Torr, below or about 18 Torr, below or about 16 Torr, below or about 14 Torr, below or about 12 Torr, below or about 10 Torr, below or about 8 Torr, below or about 6 Torr, or lower, although the pressure may also be included in ranges between any two of these stated numbers or within any smaller range encompassed by any of the stated ranges. In embodiments, the pressure may additionally be maintained at greater than or about 4 Torr, greater than or about 6 Torr, greater than or about 8 Torr, greater than or about 10 Torr, greater than or about 12 Torr, greater than or about 14 Torr, greater than or about 16 Torr, greater than or about 18 Torr, greater than or about 20 Torr, greater than or about 22 Torr, greater than or about 24 Torr, greater than or about 26 Torr, greater than or about 28 Torr, or higher. Pressure may affect deposition of the material 430, and at higher pressures, a more conformal deposition may result. At lower pressures, a top heavy deposition may result and may form a helmet or cap to protect the photoresist material 420 during trimming operations. Pressure may affect uniformity of the trimming of the photoresist material 420. At pressures below or about 30 Torr, ion distribution may increase and may provide a highly directional etch of the photoresist material 420. The highly directional etch may trim the photoresist to increase the uniformity of the apertures 425 throughout the thickness of the photoresist material 420. Conversely, as pressure increases, mean free path may reduce and directionality may suffer.

In embodiments, the deposition at operation 315 may be performed at a first pressure and the etching at operation 325 may be performed at a second pressure that is greater than the first pressure. A reduced pressure, compared to the etching at operation 325, may deposit material 430 on the upper surface of the photoresist material 420. The etching at operation 325 may still be performed at a pressure of less than or about 30 Torr to ensure a directional etch of the photoresist material 420 to remove the tapers from the photoresist material 420 defining the apertures 425.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the material" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

providing deposition precursors to a processing region of a semiconductor processing chamber, wherein a substrate is housed in the processing region, wherein the substrate comprises a photoresist material overlying a silicon-containing material, wherein the photoresist material defines a plurality of apertures, and wherein the processing region is at least partially above a substrate support on which the substrate is seated;

forming plasma effluents of the deposition precursors, wherein a source plasma power applied from a source power source to form plasma effluents of the deposition precursors is less than or about 1,000 W at a duty cycle of less than or about 50%;

depositing a material preferentially on a first surface of the photoresist material opposite a second surface of the photoresist material in contact with the silicon-containing material;

providing an etchant precursor to the processing region of the semiconductor processing chamber, wherein a bias power is applied to the substrate support from a bias power source; and etching a portion of the photoresist material, wherein the etching decreases a local critical dimension uniformity of the plurality of apertures of the photoresist material.

2. The semiconductor processing method of claim 1, wherein the deposition precursors comprise a silicon-containing precursor.

3. The semiconductor processing method of claim 1, wherein the material deposited on the photoresist material comprises silicon oxide.

4. The semiconductor processing method of claim 1, wherein the source plasma power applied from the source power source to form plasma effluents of the deposition precursors is less than or about 500 W.

5. The semiconductor processing method of claim 1, wherein the etchant precursor comprises a fluorine-containing precursor.

6. The semiconductor processing method of claim 1, wherein the local critical dimension uniformity is less than or about 3 nm 3$\sigma$.

7. The semiconductor processing method of claim 1, wherein a bias plasma power applied from the bias power source while etching the portion of the photoresist material is less than or about 500 W.

8. The semiconductor processing method of claim 1, wherein the source plasma power applied from the source power source while etching the portion of the photoresist material is less than or about 100 W.

9. The semiconductor processing method of claim 1, further comprising:

subsequent to etching the portion of the photoresist material, etching the silicon-containing material to form apertures in the silicon-containing material.

10. The semiconductor processing method of claim 1, wherein:

depositing the material on the photoresist material is performed at a first pressure; and etching the portion of the photoresist material is performed at a second pressure, wherein the second pressure is greater than the first pressure.

11. The semiconductor processing method of claim 10, wherein the second pressure is less than or about 30 Torr.

12. A semiconductor processing method comprising:

providing a silicon-containing precursor to a processing region of a semiconductor processing chamber, wherein a substrate is housed in the processing region, wherein the substrate comprises a photoresist material overlying a first silicon-containing material, wherein the photoresist material defines an aperture, and wherein the processing region is at least partially defined above a substrate support on which the substrate is seated;

forming plasma effluents of the silicon-containing precursor;

depositing a second silicon-containing material on the photoresist material;

providing a fluorine-containing precursor to the processing region of the semiconductor processing chamber; and etching a portion of the photoresist material extending outward from the second silicon-containing material.

13. The semiconductor processing method of claim 12, wherein the aperture in the photoresist material is characterized by a width of less than or about 30 nm.

14. The semiconductor processing method of claim 12, wherein the first silicon-containing material comprises a silicon-oxygen-and-nitrogen material.

15. The semiconductor processing method of claim 12, wherein a pressure within the semiconductor processing chamber is maintained at less than or about 30 Torr.

16. The semiconductor processing method of claim 12, wherein the etching decreases a local critical dimension uniformity of the aperture of the photoresist material.

17. The semiconductor processing method of claim 16, wherein, prior to the etching, the local critical dimension uniformity is greater than 4 nm 3σ.

18. A semiconductor processing method comprising:

providing a silicon-containing precursor to a processing region of a semiconductor processing chamber, wherein a substrate is housed in the processing region, wherein the substrate comprises a photoresist material overlying a first silicon-containing material, wherein the photoresist material defines an aperture, wherein a width of the aperture is less than or about 30 nm, and wherein the processing region is at least partially defined above a substrate support on which the substrate is seated;

forming plasma effluents of the silicon-containing precursor;

depositing a second silicon-containing material on the photoresist material;

halting a flow of the silicon-containing precursor;

providing a fluorine-containing precursor to the processing region of the semiconductor processing chamber; and etching a portion of the photoresist material extending outward from the second silicon-containing material.

19. The semiconductor processing method of claim 18, wherein the silicon-containing precursor comprises silicon tetrachloride ($SiCl_4$).

20. The semiconductor processing method of claim 18, wherein depositing the second silicon-containing material and etching the portion of the photoresist material are performed in the same processing region of the same semiconductor processing chamber.

* * * * *